United States Patent [19]
Jang et al.

[11] Patent Number: 5,751,017
[45] Date of Patent: May 12, 1998

[54] THIN FILM TRANSISTOR HAVING DOUBLE GATE INSULATING LAYER

[75] Inventors: Jin Jang; Hong Joo Lim; Bong Yool Ryu, all of Seoul, Rep. of Korea

[73] Assignee: LG Electronics Inc., Seoul, Rep. of Korea

[21] Appl. No.: 833,205

[22] Filed: Apr. 14, 1997

Related U.S. Application Data

[63] Continuation of Ser. No. 552,546, Nov. 3, 1995, abandoned.

[30] Foreign Application Priority Data

Nov. 3, 1994 [KR] Rep. of Korea .................. 28726/1994

[51] Int. Cl.$^6$ .................................................. H01L 29/04
[52] U.S. Cl. ................... 257/57; 257/61; 257/66; 257/347; 257/406; 257/411
[58] Field of Search .................. 257/57, 59, 66, 257/61, 72, 324, 347, 349, 406, 411

[56] References Cited

U.S. PATENT DOCUMENTS 5,289,030  2/1994  Yamazaki et al. .................. 257/66
5,468,987  11/1995  Yamazaki et al. .................. 257/412

FOREIGN PATENT DOCUMENTS 4-299864  10/1992  Japan .................. 257/59

*Primary Examiner*—Minh-Loan Tran
*Attorney, Agent, or Firm*—Morgan, Lewis and Bockius LLP

[57] ABSTRACT

A thin film transistor and method includes a substrate and a first semiconductor layer formed on the substrate. A first insulating layer is formed on the first semiconductor layer, and a doped semiconductor layer is formed on an upper portion of the first semiconductor layer at first and second sides of the first insulating layer. A second insulating layer is formed on the first insulating layer and the doped semiconductor layer, the second insulating layer having contact holes. A gate electrode is formed on a portion of the second insulating layer, and source and drain electrodes are formed on portions of the second insulating layer, the source and drain electrodes contacting the doped semiconductor layer through the contact holes, respectively.

20 Claims, 3 Drawing Sheets

THIN FILM TRANSISTOR HAVING DOUBLE GATE INSULATING LAYER

This application is a continuation of application Ser. No. 08/552,546, filed Nov. 3, 1995, now abandoned.

BACKGROUND OF THE INVENTION

1. Field of the Invention

This invention relates to a semiconductor device, and more particularly, to a thin film transistor having double gate insulating layer.

2. Discussion of the Related Art

In general, thin film transistors are widely used in semiconductor devices as driving devices for pixel electrodes in a liquid crystal display or a switching device for an SRAM.

Thin film transistors (TFTs) used in such wide fields may be a staggered type or a coplanar type depending on the position of an active layer, which is a semiconductor layer. The staggered type TFT has its source/drain electrodes disposed between semiconductor layers. A coplanar type TFT has its gate electrode and source/drain electrodes disposed on the same plane under a semiconductor layer.

Conventional thin film transistors of such types will be explained, referring to the attached drawings. FIG. 1 illustrates a sectional view of the staggered type TFT as a first example of conventional TFTs.

As shown in FIG. 1, the conventional staggered type TFT includes an insulating substrate 1. Source/drain electrodes 2 are formed a predetermined distance apart from each other on the insulating substrate 1. A high impurity concentration semiconductor layer 3 is formed on the source/drain electrodes 2. A semiconductor layer 4 is formed on the insulating substrate 1 and the high impurity concentration semiconductor layer 3. A gate insulating film 5 is formed on the entire surface of the semiconductor layer 4, and a gate electrode 6 is formed on the gate insulating film 5.

However, the conventional staggered type TFT having the aforementioned structure has problems in that forming the high impurity concentration semiconductor layer is difficult, and reliability of the contact between the high impurity concentration semiconductor layer and the source/drain electrodes is low.

To respond to such problems, an inverted staggered type TFT has been suggested as shown in FIG. 2, which illustrates a sectional view of an inverted staggered type TFT as a second example of conventional TFTs.

As shown in FIG. 2, the conventional inverted staggered type TFT includes an insulating substrate 11. A gate electrode 12 is formed on the insulating substrate 11 and a gate insulating film 13 is formed on the insulating substrate 11 and the gate electrode 12. A semiconductor layer 14 is formed on the gate insulating film 13 and high impurity concentration semiconductor layers 15 are formed a predetermined distance apart from each other on the semiconductor layer 14. Source/drain electrodes 16 are formed on the high impurity concentration semiconductor layers 15 on sides of the semiconductor layer 14 and on the gate insulating film 13.

Similar to the staggered type TFT, the inverted staggered type TFT still has a drawback when forming the high impurity concentration semiconductor layer. Moreover, because the semiconductor layer 14 of the TFT is of amorphous silicon and its channel region spaced apart from its electrodes, the mobility of charged particles by electric field effects is low as much.

FIG. 3 illustrates a sectional view of a coplanar type TFT as a third example of conventional TFTs. As shown in FIG. 3, the conventional coplanar type TFT includes an insulating substrate 21 and a semiconductor layer 22 formed on the insulating substrate 21. High impurity concentration semiconductor layers 23 is formed on the semiconductor layer 22 so as to expose a part of the semiconductor layer 22 and altered for a channel region of the semiconductor layer 22. A gate insulating film 24 is formed on the exposed part of the semiconductor layer 22 and altered for the channel region. A gate electrode 25 is formed on the gate insulating film 24. Source/drain electrodes 26 are formed on the high impurity concentration semiconductor layer 23, sides of the semiconductor layer 22, and the insulating substrate 21.

In the aforementioned structure, the high impurity concentration semiconductor layer 23 is formed by a patterning process to a full surface coating. However, the semiconductor layer 22 may be overetched to damage the surface thereof during patterning.

Consequently, because of many defects formed at the interface between the semiconductor layer 22 and the high impurity concentration semiconductor layer 23 and also at the surface of the semiconductor layer 22 from overetching during patterning of the high impurity concentration semiconductor layer 23, the mobility of charged particles at these regions are reduced.

Moreover, since complicated equipments, such as a multichamber system are required in fabricating the devices, the processes become complicated accordingly and thus, low yield has been a problem.

Another coplanar type TFT has been proposed to overcome the problems attached with the TFT in FIG. 3. FIG. 4 illustrates a sectional view of such a coplanar type TFT as a fourth example of conventional TFTs.

The coplanar type TFT of FIG. 4 includes an insulating substrate 31 and a semiconductor layer 32 formed on the insulating substrate 31. High impurity concentration semiconductor layers 35 are formed a predetermined distance apart from each other on the upper surface of the semiconductor layer 32. A gate insulating film 33 and a gate electrode 34 are respectively formed on the spaced apart portion of the high impurity concentration semiconductor layers 35. Source/drain electrodes 36 are formed on the high impurity concentration semiconductor layer 35 and the insulating substrate 31 a predetermined distance apart from the gate electrode 34. An insulating film 37 is formed on the high impurity concentration semiconductor layer 35 and the gate electrode 34 at the spaced apart portion.

The high impurity concentration semiconductor layer 35 is formed by injecting ions thereto using the gate insulating film 33 as a mask. However, since the gate insulating film 33 is formed by thermal oxidation at a high temperature of about 800 deg.C., low cost glass substrate can not be used.

Moreover, formation of the gate electrode and the source/drain electrodes in separate processes requires additional process steps that can lead to low yield problems.

SUMMARY OF THE INVENTION

Accordingly, the present invention is directed to a thin film transistor having double gate insulating layer that substantially obviates one or more of the problems due to limitations and disadvantages of the related art.

An object of the present invention is the provision of a thin film transistor and a method for improving the performance of device by preventing defects at interfaces between semiconductor layers.

Another object of the present invention is the provision of a thin film transistor and a method for improving the mobility of charged particles.

A further object of the present invention is the provision of a thin film transistor and a method for improving the yield by simplifying the fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the invention, as embodied and broadly described, the invention includes a thin film transistor including a substrate; a first semiconductor layer on the substrate; a first insulating layer on the first semiconductor layer; a doped semiconductor layer on an upper portion of the first semiconductor layer at first and second sides of the first insulating layer; a second insulating layer on the first insulating layer and the doped semiconductor layer, the second insulating layer having contact holes; a gate electrode on a portion of the second insulating layer; and source and drain electrodes on portions of the second insulating layer, the source and drain electrodes contacting the doped semiconductor layer through the contact holes, respectively.

In another aspect, the invention includes a method for fabricating a thin film transistor, the method including the steps of forming a substrate; forming a first semiconductor layer on the substrate; forming a first insulating layer on the first semiconductor layer; forming a doped semiconductor layer on an upper portion of the first semiconductor layer at first and second sides of the first insulating layer; forming a second insulating layer on the first insulating layer and the doped semiconductor layer; forming contact holes in the second insulating layer above the doped semiconductor layer at the first and second sides of the first insulating layer, respectively; forming a gate electrode on a portion of the second insulating layer; and forming source and drain electrodes on portions of the second insulating layer, the source and drain electrodes contacting the doped semiconductor layer through the contact holes, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate an embodiment of the invention and together with the description, serve to explain the principles of the invention.

In the drawings.

DETAILED DESCRIPTION OF THE INVENTION

Reference will now be made in detail to the preferred embodiment of the invention, an example of which is illustrated in the accompanying drawings.

Figure 1:
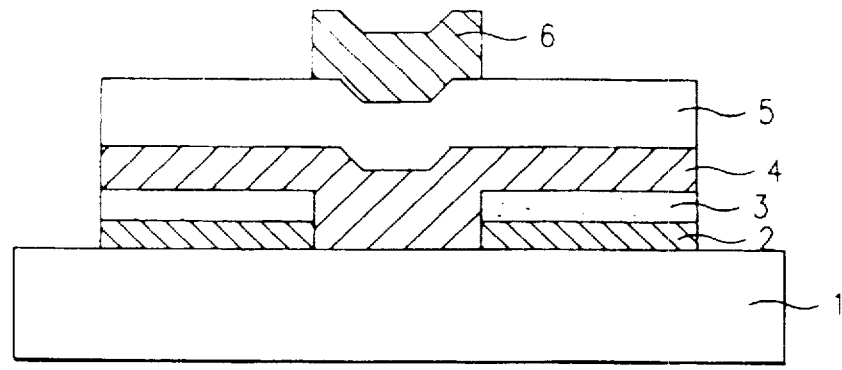
FIG. 1 illustrates a sectional view of a first conventional thin film transistor.
Figure 2:
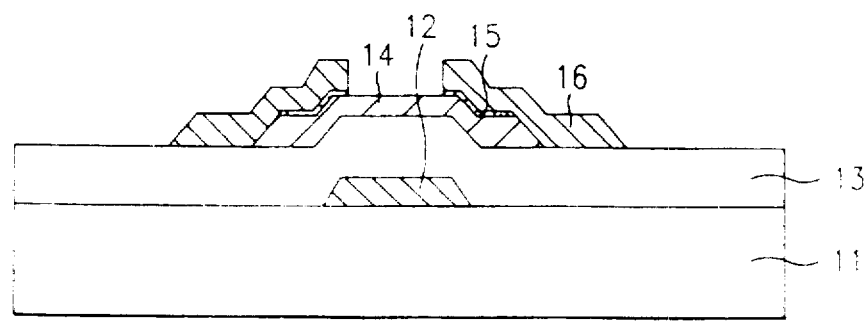
FIG. 2 illustrates a sectional view of a second conventional thin film transistor.
Figure 3:
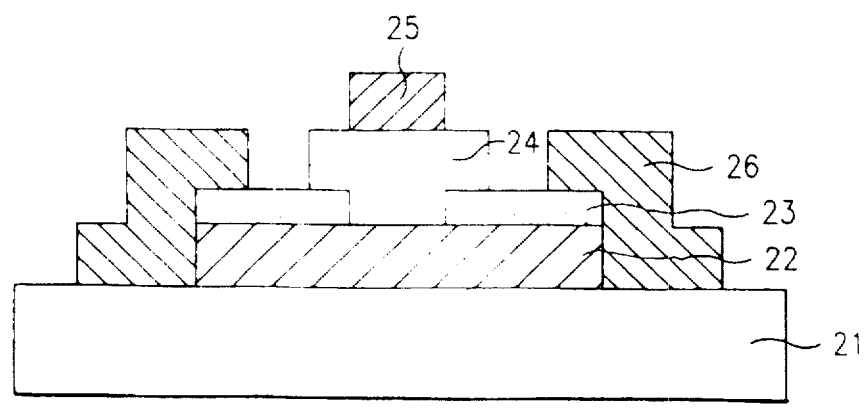
FIG. 3 illustrates a sectional view of a third conventional thin film transistor.
Figure 4:
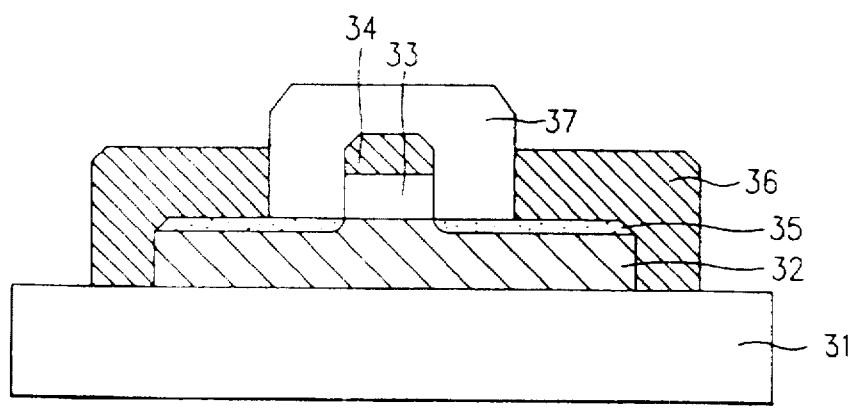
FIG. 4 illustrates a sectional view of a fourth conventional thin film transistor.
Figure 5:
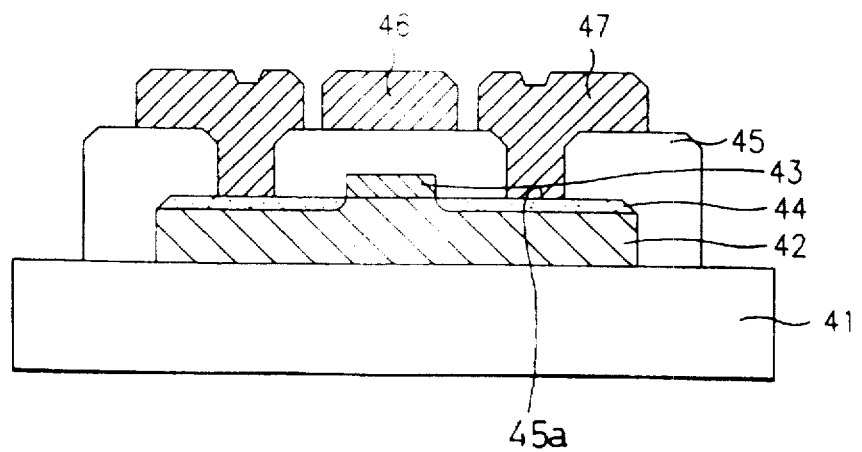
FIG. 5 is a sectional view of a thin film transistor in accordance with a preferred embodiment of the present invention.

As shown in FIG. 5, a preferred embodiment of a thin film transistor of the present invention includes an insulating substrate 41 and a semiconductor layer 42 formed on the insulating substrate 41. A stopper 43 is formed on the semiconductor layer 42. High impurity concentration semiconductor layers 44 are formed on the upper surfaces of the semiconductor layer 42 except at the portion contacting the stopper 43. A gate insulating film 45 having two contact holes 45a respectively at the high impurity concentration semiconductor layers 44 are formed over the entire substrate. A gate electrode 46 is formed on the gate insulating film 45. Source/drain electrodes 47 are formed on the gate insulating film 45 and contact the high impurity concentration semiconductor layers 44 through the two contact holes 45a, respectively.

Also, a silicide layer may be formed on the high impurity concentration semiconductor layers 44 using a metal, such as Cr, Mo, Nb, Ti, or W to reduce serial resistance.

A method for fabricating the thin film transistor in accordance with the preferred embodiment of the present invention will be explained in detail referring to FIGS. 6A to 6E.

Figure 6A:
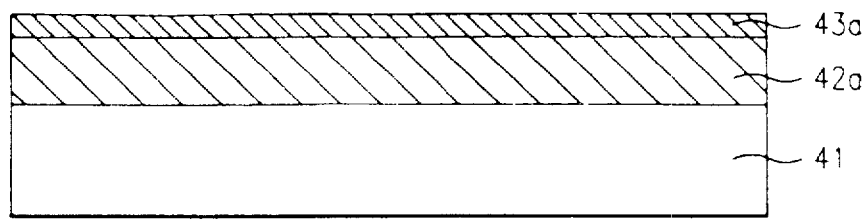
FIGS. 6A to 6E are sectional views illustrating processes for forming a thin film transistor in accordance with the present invention.

First, as shown in FIG. 6A, an insulating substrate 41 is provided and a polycrystal silicon layer (or an amorphous silicon layer) 42a and a nitride film (or an oxide film) 43a are deposited on the insulating substrate 41, successively. For the case of an amorphous silicon layer, the amorphous silicon is deposited on the substrate 41 and subject to laser annealing to produce a polycrystal silicon. However, the amorphous silicon layer may be used as the semiconductor layer instead of the polycrystal silicon layer. Alternatively, a polycrystal silicon layer may be produced by successively depositing an amorphous silicon layer and a capping layer (insulating material) on the amorphous silicon layer and laser annealing the amorphous silicon layer through the capping layer. Here, the insulating layer 43a may be used as the capping layer.

The sequential formation of the polycrystal silicon layer 42a and the nitride film 43a by chemical vapor deposition leads to less defects at the interface between the layers and a comparatively low formation temperature improves heat treatment properties.

The formation temperature for polycrystal silicon (or amorphous silicon), for example, may be about 200–600 deg.C., and for a nitride film (or an oxide film), about 200–500 deg.C.

Figure 6B:
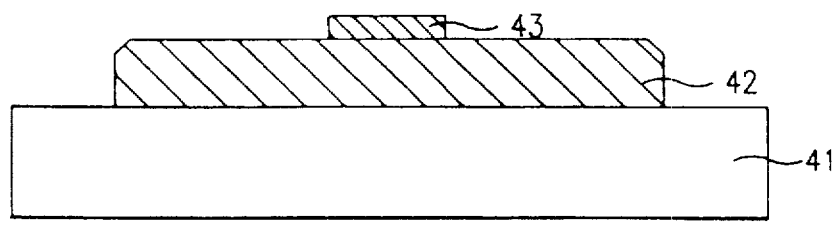

Then, as shown in FIG. 6B, the polycrystal silicon layer 42a and the nitride film 43a are subjected to a primary patterning using an identical pattern to form a semiconductor layer. Next, by subjecting the nitride film 43a to a secondary patterning using another pattern, a semiconductor layer 42 and a stopper 43 can be formed on the insulating substrate 41. The stopper 43 should be formed on top of the semiconductor layer 42 corresponding to a predetermined channel length of the thin film transistor.

Figure 6C:
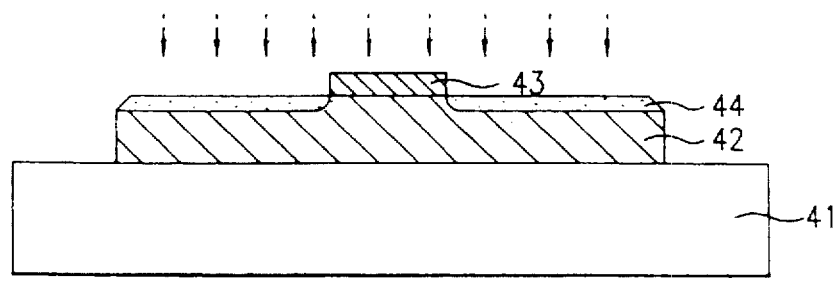

Next, as shown in FIG. 6C, N-type or P-type impurity ions are injected into the semiconductor layer 42 except at the portion having the stopper 43 formed thereon, to form high impurity concentration semiconductor layers 44 to a predetermined thickness on the upper surface of the semiconductor layer 42. The high impurity concentration semiconductor layers 44 are formed as ohmic contacts to source/drain electrodes to be formed in the following process.

Figure 6D:
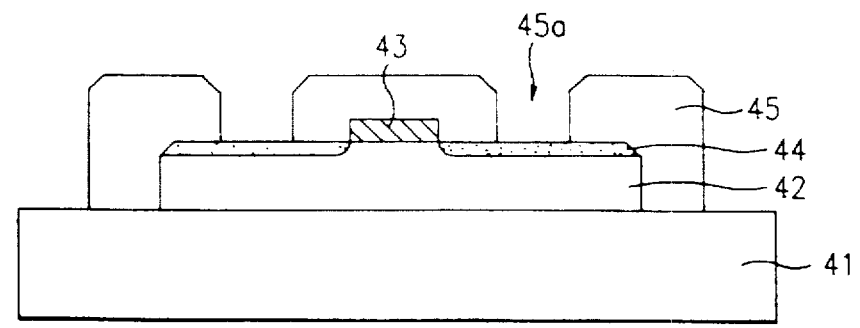

As shown in FIG. 6D, by depositing an insulating material on the entire substrate, a gate insulating film 45 is formed. Next, the gate insulating film 45 is etched so as to expose a part of the upper surface of each of the high impurity concentration semiconductor layers 44, to form two contact holes 45a on both sides of the stopper 43.

Figure 6E:
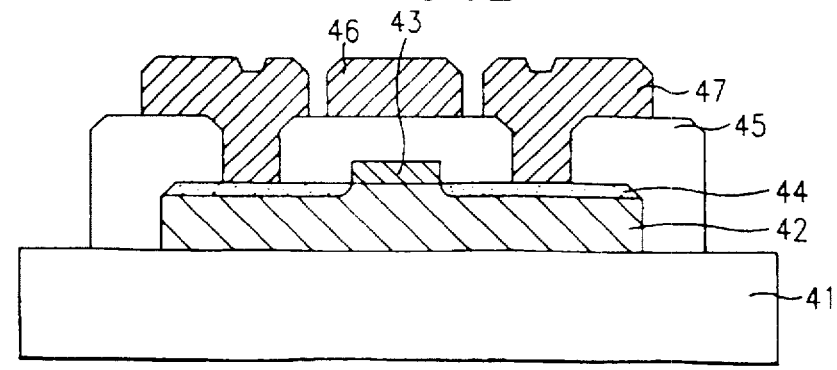

Then, as shown in FIG. 6E, a conductive material, such as Cr or Al, is deposited and selectively patterned to form a gate electrode 46 on the gate insulating film 45 over the stopper 43. Source/drain electrodes 47 are also formed which contact the high impurity concentration semiconductor layers 44 through respective contact holes 45a on the remaining portions the gate insulating film 45 excluding the portion of the gate insulating film over the stopper 43.

As explained above, the thin film transistor in accordance with the present invention allows continuous formation of the semiconductor layer and the stopper at a lower temperature and thus reduces defects and improves mobility of charged particles at the interface between the semiconductor layer and the stopper layer. Also, using a low temperature for forming the semiconductor layer and the stopper allows the use of a less expensive substrate that is susceptible to heat, thus reducing cost.

Moreover, the simultaneous formation of the gate electrode and the source/drain electrodes using one process step reduces the number of fabrication process steps.

Accordingly, the thin film transistor in accordance with the present invention allows a simpler fabrication process and improves the yield and reliability of the device performance.

It will be apparent to those skilled in the art that various modifications and variations can be made in the thin film transistor and method of the present invention without departing from the spirit or scope of the invention. Thus, it is intended that the present invention cover the modifications and variations of this invention provided they come within the scope of the appended claims and their equivalents.

What is claimed is:

1. A thin film transistor comprising:

a substrate;

a first semiconductor layer on the substrate;

a first insulating layer on the first semiconductor layer;

a doped semiconductor layer on only an upper portion of the first semiconductor layer at first and second sides of the first insulating layer;

a second insulating layer on the first insulating layer and the doped semiconductor layer, the second insulating layer having contact holes and a portion contacting the substrate;

a gate electrode on a portion of the second insulating layer; and source and drain electrodes on portions of the second insulating layer, the source and drain electrodes contacting the doped semiconductor layer through the contact holes, respectively.

2. The thin film transistor according to claim 1, wherein the substrate includes an insulating material.

3. The thin film transistor according to claim 2, wherein the insulating material includes a transparent material.

4. The thin film transistor according to claim 1, wherein the first insulating layer includes a stopper.

5. The thin film transistor according to claim 1, wherein the doped semiconductor layer includes a high concentration of impurities.

6. The thin film transistor according to claim 1, wherein the second insulating layer covers the first insulating layer.

7. The thin film transistor according to claim 1, wherein the gate electrode is above a portion of the first insulating layer.

8. The thin film transistor according to claim 1, wherein the first semiconductor layer includes one of an amorphous silicon and a polycrystal silicon.

9. The thin film transistor according to claim 1, further comprising a silicide layer on the doped semiconductor layer adjacent to the contact holes, respectively.

10. The thin film transistor according to claim 1, wherein a channel region is below a portion of the first insulating layer.

11. The thin film transistor according to claim 1, wherein the second insulating layer having a portion over the first semiconductor layer.

12. A thin film transistor comprising:

a substrate;

a first semiconductor layer on the substrate;

a first insulating layer on the first semiconductor layer;

a doped semiconductor layer on only an upper portion of the first semiconductor layer at first and second sides of the first insulating layer;

a second insulating layer on the first insulating layer and the doped semiconductor layer, the second insulating layer having contact holes, a portion contacting the substrate and adjacent to the first and second sides of the first semiconductor layer;

a gate electrode on a portion of the second insulating layer; and source and drain electrodes on portions of the second insulating layer, the source and drain electrodes contacting the doped semiconductor layer through the contact holes, respectively.

13. The thin film transistor according to claim 12, wherein the first insulating layer includes a stopper.

14. The thin film transistor according to claim 12, wherein the doped semiconductor layer includes a high concentration of impurities.

15. The thin film transistor according to claim 12, wherein the second insulating layer covers the first insulating layer.

16. The thin film transistor according to claim 12, wherein the gate electrode is above a portion of the first insulating layer.

17. The thin film transistor according to claim 12, wherein the first semiconductor layer includes one of an amorphous silicon and a polycrystal silicon.

18. The thin film transistor according to claim 12, further comprising a silicide layer on the doped semiconductor layer adjacent to the contact holes, respectively.

19. The thin film transistor according to claim 12, wherein a channel region is below a portion of the first insulating layer.

20. The thin film transistor according to claim 12, wherein the second insulating layer having a portion over the first semiconductor layer.

* * * * *